(12) United States Patent
Lee

(10) Patent No.: US 6,922,161 B2
(45) Date of Patent: Jul. 26, 2005

(54) DELTA-SIGMA MODULATOR FOR REDUCING QUANTIZATION NOISE AND OVERSAMPLING RATIO (OSR)

(75) Inventor: Yong-Hee Lee, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/723,159

(22) Filed: Nov. 26, 2003

(65) Prior Publication Data

US 2004/0130471 A1 Jul. 8, 2004

(30) Foreign Application Priority Data

Jan. 3, 2003 (KR) .............................. 10-2003-0000354

(51) Int. Cl.[7] .............................................. H03M 3/00
(52) U.S. Cl. ..................................... 341/143; 341/155
(58) Field of Search ................................ 341/143, 155, 341/144

(56) References Cited

U.S. PATENT DOCUMENTS

| 4,468,790 | A | * | 8/1984 | Hofelt ........................ 375/245 |
|---|---|---|---|---|
| 4,862,169 | A | * | 8/1989 | van Bavel et al. .......... 341/143 |
| 4,876,543 | A | * | 10/1989 | van Bavel .................. 341/143 |
| 4,920,544 | A | * | 4/1990 | Endo et al. ................. 375/243 |
| 5,030,952 | A | * | 7/1991 | Ledzius et al. ............. 341/143 |
| 5,061,928 | A | * | 10/1991 | Karema et al. ............. 341/143 |
| 5,148,167 | A | * | 9/1992 | Ribner ....................... 341/143 |
| 5,298,900 | A | * | 3/1994 | Mauthe et al. ............. 341/143 |
| 5,446,460 | A | * | 8/1995 | Cabler ........................ 341/143 |
| 6,300,890 | B1 | * | 10/2001 | Okuda et al. ............... 341/143 |
| 6,515,607 | B2 | * | 2/2003 | Liu et al. .................... 341/143 |

* cited by examiner

Primary Examiner—Michael Tokar
Assistant Examiner—Khai Nguyen
(74) Attorney, Agent, or Firm—F. Chau & Associates, LLC

(57) ABSTRACT

A Delta-Sigma modulator that allows for a reduction in the oversampling ratio (OSR) of a radio frequency (RF) Analog to Digital Converter. The modulator comprises a 1-bit quantizer, a N-bit quantizer and a digital quantization error correction circuit that corrects a for quantization error by using digital output signals from the 1-bit quantizer and from the N-bit quantizer, and reduces the quantization noise when the modulator transforms an analog input signal into the digital output signal. The quantization noise is reduced by ditigally correcting quantization errors, which affect the signal-to-noise ration (SNR) characteristic, using digital output signals of the multi-bit quantizer and the 1-bit quantizer. Also, a DC offset which may be generated by the multi-bit quantizer can be digitally removed.

17 Claims, 9 Drawing Sheets

DELTA-SIGMA MODULATOR FOR REDUCING QUANTIZATION NOISE AND OVERSAMPLING RATIO (OSR)

BACKGROUND OF THE INVENTION

1. Field of the Invention

The present invention relates to Analog-to-Digital converters for radio frequency (RF) applications and, more particularly, to a Delta-Sigma modulator capable of reducing quantization noises by digitally correcting errors.

2. Description of the Related Art

Figure 1A:
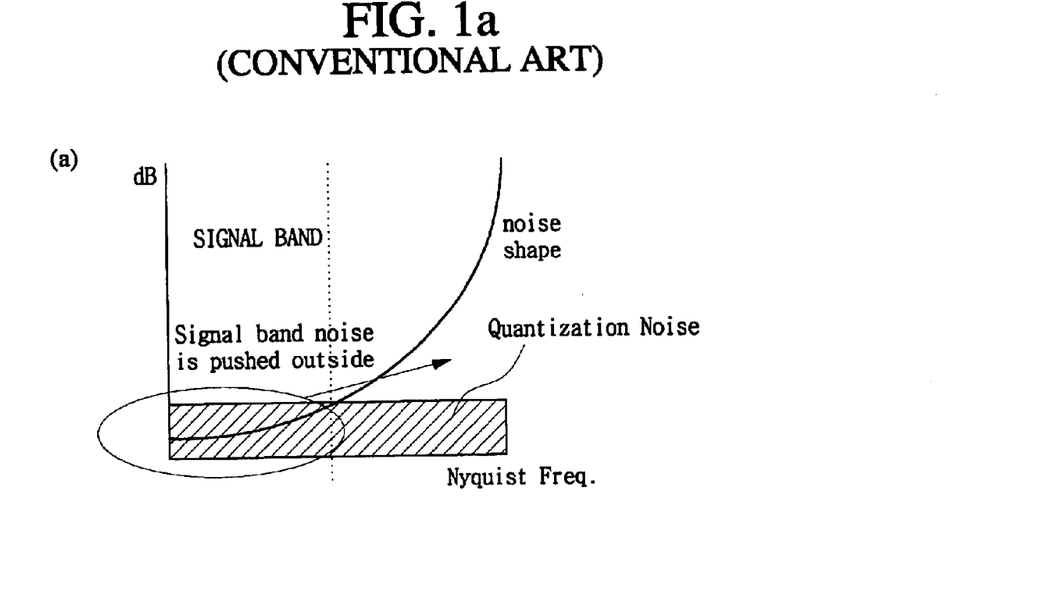
FIG. 1a is a diagram showing how a noise in a signal band can be reduced using a noise shaping technology.
Figure 1B:
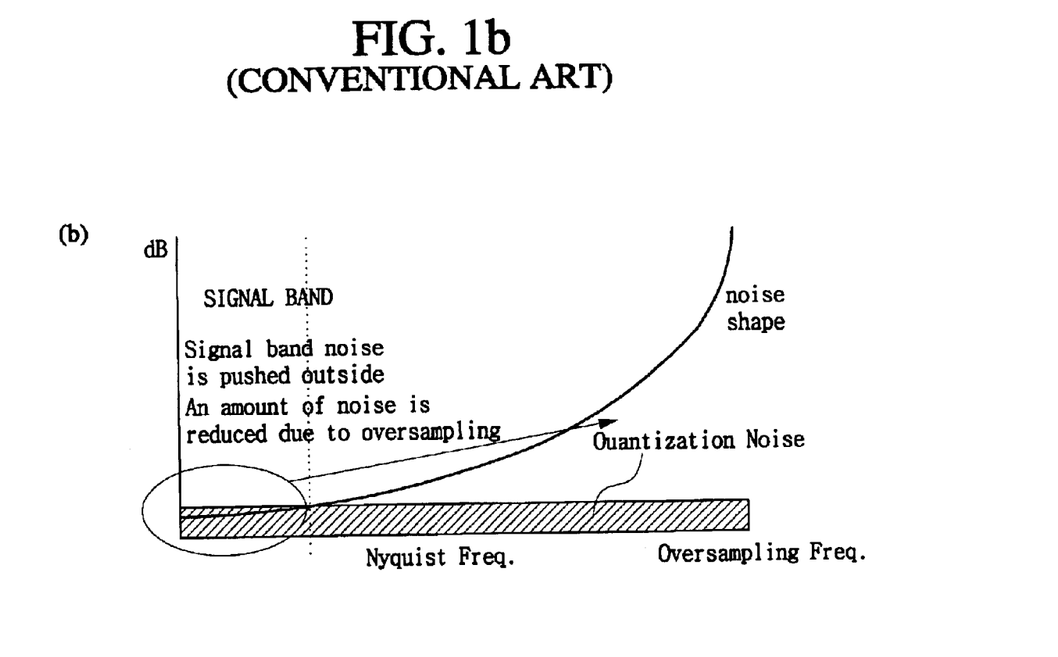
FIG. 1b is a diagram showing how a noise in a signal band can be reduced using oversampling and a noise shaping technology.
Figure 2:
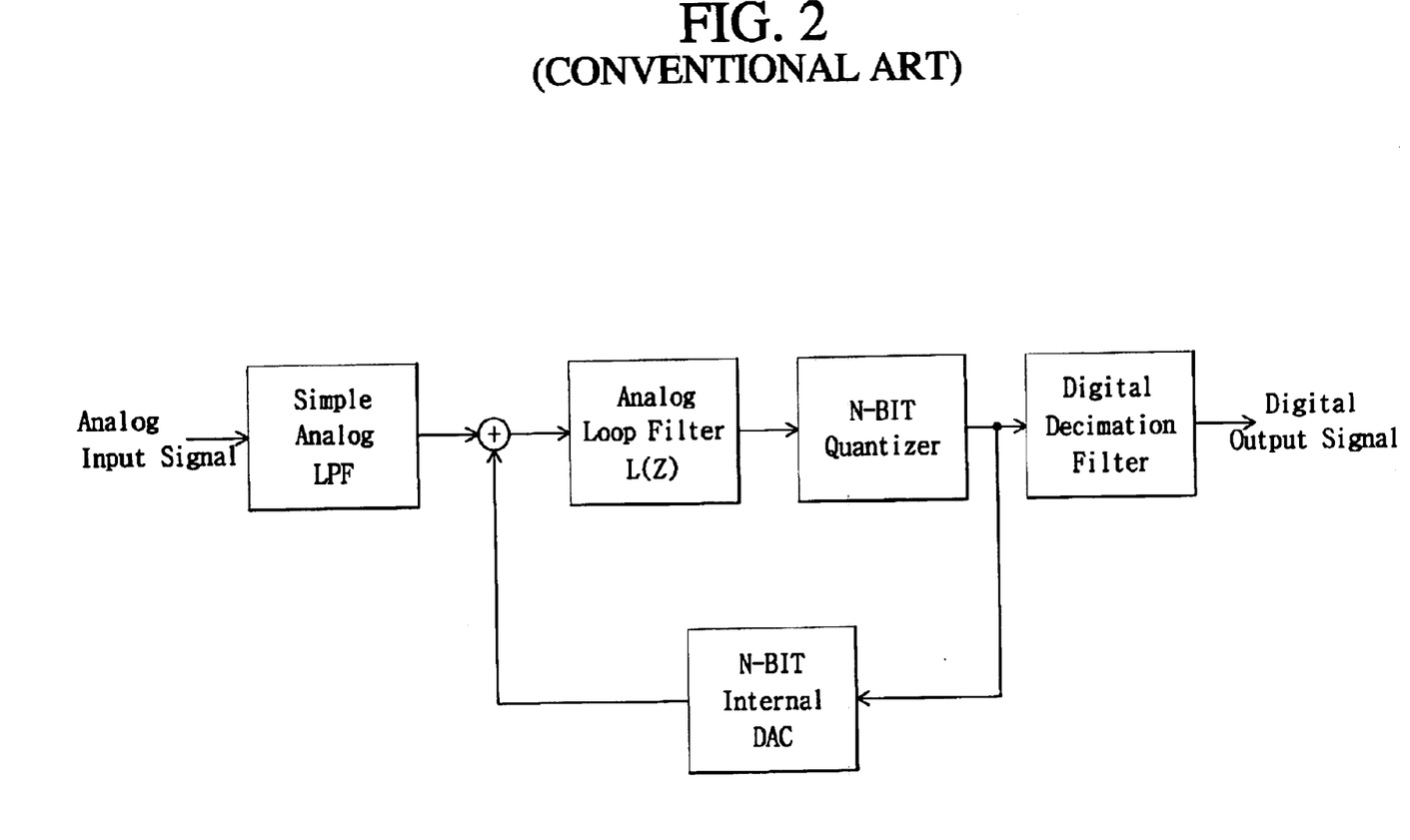
FIG. 2 is a block diagram of a conventional A/D converter using a Delta-Sigma modulator.

Bandpass Delta-Sigma A/D converters perform direct conversion of a RF or IF narrow band signal to digital for processing and heterodyning in digital domain. The ability of performing narrowband conversion at a frequency other than DC makes them particularly attractive for radio applications. Generally, in an input-output stage or a transceiver stage of a certain radio frequency (RF) application field operating at a lower frequency requires a resolution of high precision. Semiconductor bandpass delta-sigma modulators are used to digitize IF signals with high resolution. A signal conversion is performed by making use of a Delta-Sigma A/D converter or a Delta-Sigma D/A converter including a Delta-Sigma modulator and a digital filter. The Delta-Sigma modulator makes use of an oversampling and a noise shaping technology. The oversampling spreads the noise energy over a wider frequency range (FIGS. 1a and 1b). Delta-sigma converters exploit this effect by following the 1-bit ADC with a digital (e.g., lowpass) filter (FIG. 2). This action enables Delta-sigma converters to achieve wide dynamic range from a low-resolution ADC.

FIG. 1a shows how a noise in a signal band can be reduced by using a noise shaping technology, and FIG. 1b shows how a noise in a signal band can be reduced by using an oversampling and a noise shaping technology. The noise shaping technology pushes a quantization noise occurring in a signal conversion to a non-used signal band, and the degree of noise shaping depends upon the order (e.g., $1^{st}$, $2^{nd}$, $3^{rd}$, etc.) of the Delta-Sigma modulator. The oversampling is a technology which reduces the quantization noise within a signal band used by raising the sampling frequency band. By oversampling the traditional pulse counting (Nyquist) frequency of a converter, noise shaping results. Also, the Delta-Sigma modulator operates as a high-pass filter and keeps the signal band high using the oversampling technology, so a noise ratio of the signal band becomes relatively low even though the order of the converter is low and a signal-to-noise ratio (SNR) in the signal band can be improved. Thus, the Delta-Sigma modulation is a technology in which a high resolution can be obtained by reducing the noise within the used signal band by employing noise shaping and oversampling technology.

FIG. 2 shows a block diagram of a conventional A/D converter 200 embodied using a Delta-Sigma modulator. The characteristic of the A/D converter shown in FIG. 2 is determined by the order L of an Analog Loop Filter and the number of bits N of an N-BIT Quantizer in the case where the oversampling ratio OSR is fixed. The heart of a Delta-Sigma modulator and any other analog-to-digital converter (ADC) is a quantizer, a device which maps analog signal amplitude into a finite set of possible representative values, often as few as two (N=1). The quantization operation is inherently nonlinear.

Generally, in the A/D converter 200 embodied using the Delta-Sigma modulator, a 1-bit quantizer (N=1) is used in order to avoid a non-linear characteristic of the N-BIT Quantizer. An A/D converter embodied using the Delta-Sigma modulator with N equal to 1 is also called as a 1-bit A/D converter.

Generally, in order to obtain an appropriate characteristic of a signal-to-noise ratio (SNR) required in each application field, an inverse proportional relation is established between the order L and the OCR of the modulator. For example, in the case of a voice band (4 kHz, Fs=8 kHz), it is desired that L=2, OSR=256 and N=1, while in the case of an audio band (20 kHz, Fs=44.1 kHz), it is desirable that L=4, OSR=64 and N=1. Here, Fs is a sampling frequency. According to Nyquist theory, Fs must be at least the Nyquist Frequency $F_N$ which is twice the bandwidth of the input signal. The oversampling ratio OSR is the ratio of Fs to the Nyquist frequency $F_N$. A deterioration of a signal-to-noise ratio (SNR) caused by a low L value can be canceled by increasing OSR.

Since the oversampling operation is performed in a sampling frequency Fs that is higher than the Nyquist frequency by the OSR, it is often not practicable to construct a circuit using the oversampling technology in applications involving higher frequency RF signal bands (e.g., microwave bands). If the OSR is 256 and the Nyquist frequency $F_N$ is 2 MHz, an operating frequency becomes 512 MHz, which presents a challenge. And generally, if the OSR is lowered, the order L of the modulator is increased, so that there are many disadvantages in noise, power consumption and cost when a circuit uses a lowered OSR. Particularly, in case of an analog modulator, since most of circuits include analog circuits which are sensitive to noise, the modulator is significantly influenced by the noise and it is not easy to implement it.

Recently, a variety of methods have been suggested in which even using a lowered OSR and a lowered order L of a modulator, an appropriate noise characteristic for any RF application can be obtained. Some major methods among them include a multi-stage noise shaping (MASH) method wherein a quantization noise is added in each stage and the noise is removed by filtering Another method is to use a dual quantizer of a 1-bit and an N-bit, removing the quantization noise occurred in the 1-bit quantizer in an analog method, and outputting through a digital noise shaping method. The method of using the dual quantizer of the 1-bit and the N-bit, and removing the quantization noise through digital noise shaping is disclosed in U.S. Pat. No. 6,300,890 and shown in FIG. 3.

Figure 3:
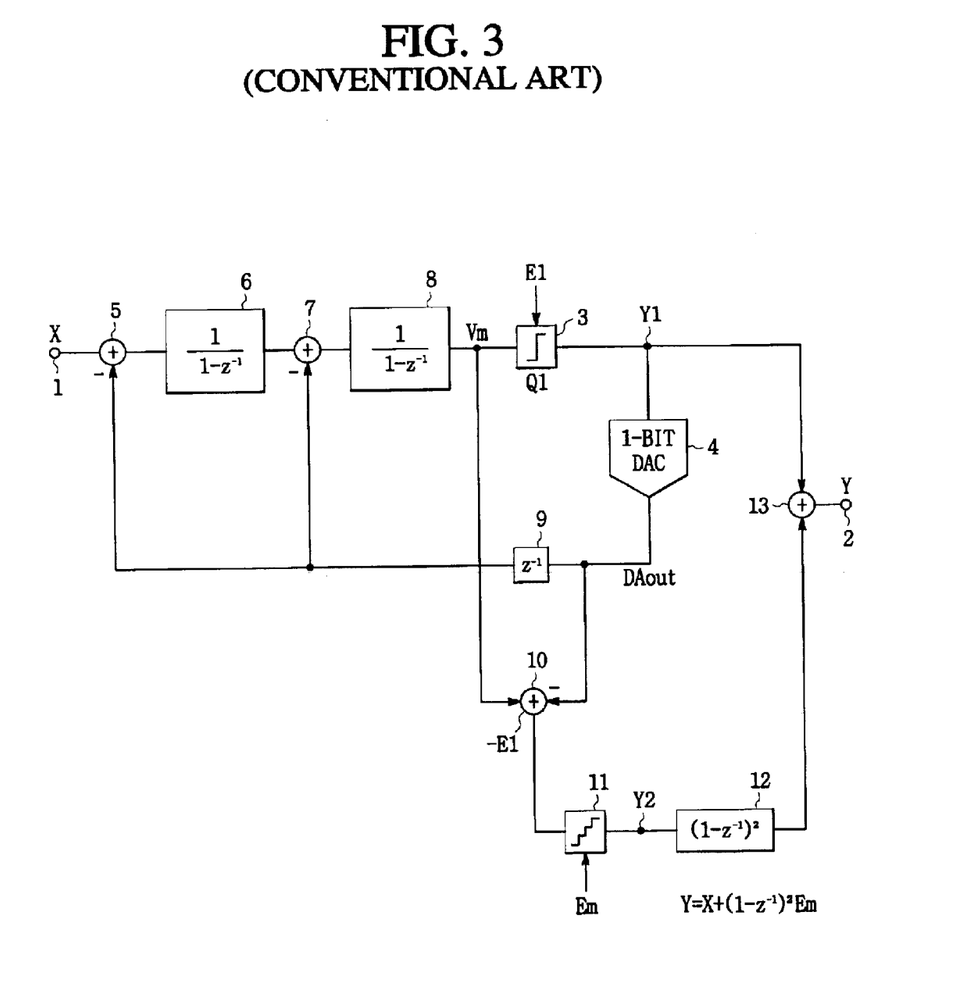
FIG. 3 is a block diagram of a conventional Delta-Sigma modulator using a 1-bit quantizer and a multi-bit quantizer and correcting a quantization noise in an analog mode.

FIG. 3 shows a conventional Delta-Sigma modulator 300 that can quantize an analog input signal X using a first feedback loop including the 1-bit quantizer 3 (Q1), and reduce a quantization noise by performing a quantization noise shaping using a second feedback loop including a multi-bit quantizer 11. The Delta-Sigma modulator shown in FIG. 3 subtracts a quantized analog output signal of a 1-bit D/A converter 4 from an analog output signal of a final stage of integrator 8 in order to calculate a quantization error, and then removes the quantization noise E1 introduced in the 1-bit D/A converter 4. The integrator acts as a lowpass filter to the input signal and a highpass filter to the quantization noise. Thus, most of the quantization noise is pushed into higher frequencies (FIG. 1b). Oversampling has changed not the total noise power, but its distribution. However, since a signal subtracted in a subtractor 10 is an analog signal and a signal loop for removing the quantization noise is an analog circuit, the modulator can be much affected by noise.

SUMMARY OF THE INVENTION

A Delta-Sigma modulator in accordance to the present invention includes a 1-bit quantizer, a multi-bit quantizer and an error correction circuit, and reduces a quantization noise by correcting an error in a digital area using digital output signals of the multi-bit quantizer and the 1-bit quantizer, and minimizes the effects caused by noise since a loop of correction circuit is operated in a digital area.

The present invention provides a Delta-Sigma modulator that reduces quantizatioin noise and minimizes effects of noise, while reducing an oversampling ratio (OSR).

One aspect of the present invention provides a Delta-Sigma modulator wherein the modulator comprises a 1-bit quantizer, a multi-bit quantizer and an error correction circuit, digitally corrects a quantization noise error by using digital output signals of the 1-bit quantizer and of the multi-bit quantizer, and thus reduces the quantization noise when the a Delta-Sigma modulator transforms an analog input signal into the digital output signal. A Delta-Sigma modulator, for inputting an analog input signal and for outputting a digital output signal, comprises: an integration unit for receiving the analog input signal and for outputting an integrated signal; a 1-bit quantizer for quantizing the integrated signal output by the integration unit and for outputting a first quantized digital signal; a N-bit quantizer for quantizing the integrated signal output by the integration unit and for outputting a second quantized digital signal. The Delta-Sigma modulator may further comprise an error correction circuit, for digitally correcting quantization noise by using the first and second quantized digital signals of the 1-bit quantizer and the N-bit quantizer, respectively, and for reducing the quantization noise when the Delta-Sigma modulator transforms the analog input signal into a digital output signal of the Delta-Sigma modulator.

In accordance with another aspect of the present invention, there is provided a Delta-Sigma modulator, for inputting an analog input signal and for outputting a digital output signal, comprising: an integration unit including one or more stages each stage having a subtractor for subtracting a quantized analog output signal output by a 1-bit D/A converter from the analog input signal, and an integrator for integrating an output of its respective subtractor; a 1-bit quantizer for quantizing the integrated signal output by the integration unit and for outputting a first quantized digital signal; the 1-bit digital-to-analog (D/A) converter for converting the first quantized digital signal into the quantized analog signal; a N-bit quantizer for quantizing the integrated signal output by the integration unit and for outputting a second quantized digital signal; a terminal subtractor for subtracting a digital error signal which is a derivative of the second quantized digital signal from the first quantized digital signal and outputting its result as the digital output signal of the Delta-Sigma modulator. The Delta-Sigma modulator may further comprise: an error correction circuit for receiving the second quantized digital signal from the N-bit quantizer and for receiving the first quantized digital signal from the 1-bit quantizer, and for correcting their quantization errors, and for outputting the digital error signal to the terminal subtractor; a delay element for delaying the first quantized digital signal output by the 1-bit quantizer, and for outputting the first quantized digital signal to the terminal subtractor.

In accordance with yet another aspect of the present invention a Delta-Sigma modulator provided may include an error correction circuit that includes an error subtractor for subtracting a digital output signal of the N-bit quantizer from a digital output of the 1-bit quantizer and calculating the correlation between a quantization noise occurring in the 1-bit quantizer and a noise of the multi-bit quantizer; and a differentiator for differentiating an output signal of the error subtractor, embodying a function of a high-pass filter for removing noise occurring in the quantizers, and for minimizing the noise output in a desired signal band.

The Delta-Sigma modulator provided may further include a limiter between a N-bit quantizer and the error correction circuit for removing a DC offset which may be generated when the N-bit quantizer is used.

BRIEF DESCRIPTION OF THE DRAWINGS

The invention will be more clearly understood from the following detailed description taken in conjunction with the accompanying drawings, in which.

DETAILED DESCRIPTION OF PREFERRED EMBODIMENTS

Hereinafter, a Delta-Sigma modulator in accordance with the present invention will be described in connection with the accompanying drawings.

Figure 4:
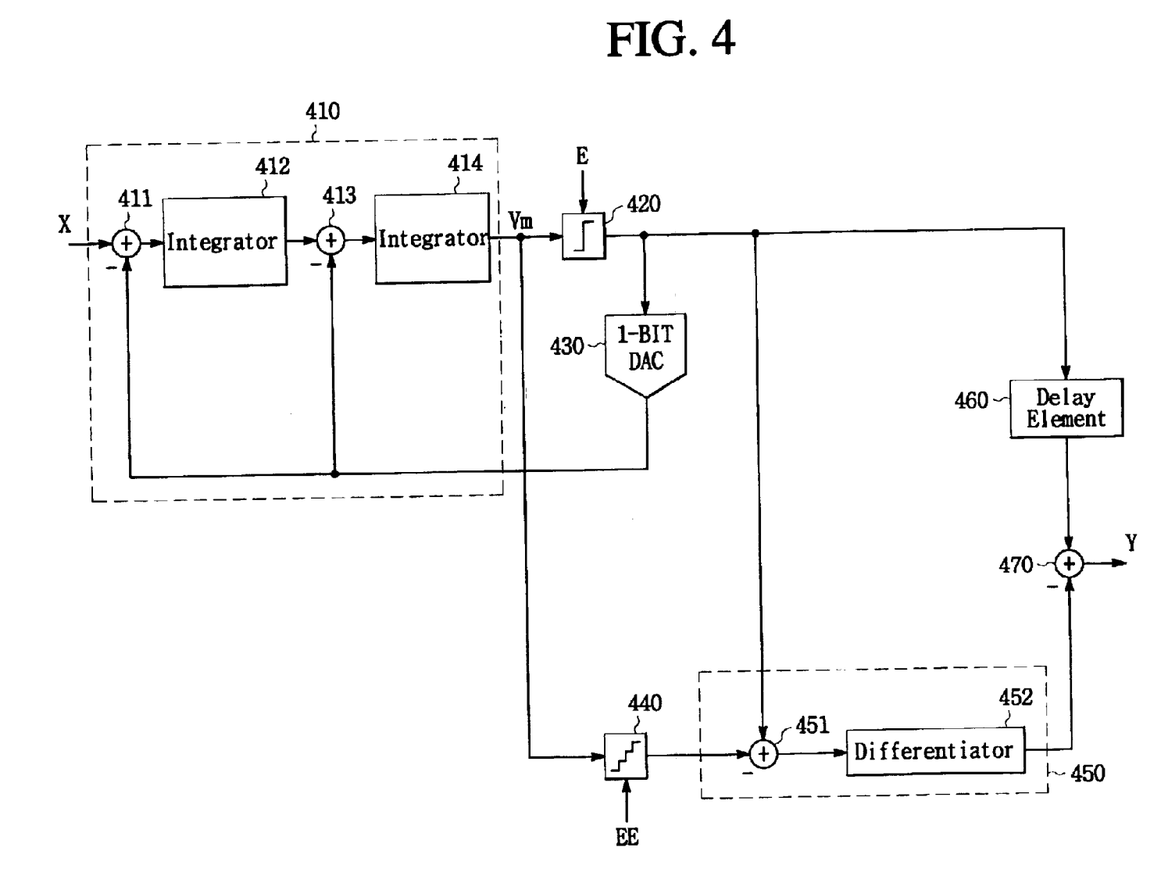
FIG. 4 is a view showing a second order Delta-Sigma modulator using a 1-bit quantizer and a multi-bit quantizer that corrects a quantization noise in a digital mode in accordance with a first embodiment of the present invention.

FIG. 4 is a view showing a Delta-Sigma modulator using a 1-bit quantizer and a multi-bit quantizer in accordance with a first embodiment of the present invention.

The Delta-Sigma modulator shown in FIG. 4 includes an input terminal for inputting an analog input signal X; an output terminal for outputting a digital output signal Y; a 1-bit quantizer 420, connected between the input terminal and the output terminal, for quantizing an inputted analog signal and outputting a quantized digital signal; a 1-bit D/A converter 430 for converting the quantized digital signal into a quantized analog signal; a series of input integration circuits (within integration unit 410) including one or more stages having a subtractor and an integrator (subtracting a quantized analog output signal of the 1-bit D/A converter 430 from an analog input signal X, integrating its result), and sending its output to the 1-bit quantizer 420; a multi-bit quantizer 440 for quantizing an output signal of the series of input integration circuits 410 and outputting a quantized digital signal; an error correction circuit 450 for receiving digital output signals of the multi-bit quantizer 440 and of the 1-bit quantizer 420 and correcting their errors; a delay element 460 for delaying the quantized digital output signal of the 1-bit quantizer 420; and a subtractor 470 for subtracting an output signal of the error correction circuit 450 from the output signal of the delay element 460 and outputting its result.

The series of input integration circuits 410 includes: a subtractor 411 for subtracting an analog output signal of the 1-bit D/A converter 430 from the analog input signal X; an integrator 412 for integrating an output signal of the subtractor 411; a subtractor 413 for subtracting an analog output signal of the 1-bit D/A converter 430 derived from an output signal of the integrator 412; and an integrator 414 for integrating an output signal of the subtractor 413.

The error correction circuit 450 includes a subtractor 451 for subtracting a digital output signal of the multi-bit quantizer 440 from a digital output signal of the 1-bit quantizer 420 and calculating the correlation between a quantization noise occurring in the 1-bit quantizer and a noise of the multi-bit quantizer; and a differentiator 452 for differentiating an output signal of the subtractor 451, embodying a function of a high-pass filter for filtering noise occurring in the quantizers (420 and 440), and minimizing noise in a desired signal band.

Hereinafter, a Delta-Sigma modulator in accordance with a first embodiment of the present invention will be described in connection with FIG. 4.

A series of input integration circuits 410 in FIG. 4 includes one or more stages that include a subtractor and an integrator. FIG. 4 shows an example of a second order circuit which is constructed as two stages. An analog input signal X is quantized by a 1-bit quantizer 420 and transformed into a digital signal. Noise is shaped outside of the desired signal band by a feedback loop which includes a 1-bit quantizer 420, a 1-bit D/A converter 430, subtractors 411 and 413, and integrators 412 and 414, and therefore noise in the desired signal band become relatively small. The analog input signal X is continuously quantized. The output signal of the 1-bit quantizer 420 may include the quantization noise E since a quantization process of the 1-bit quantizer 420 can introduce some noise into its output signal. The multi-bit quantizer 440 receives an analog output signal Vm from the series of input integration circuits (integration unit 410), that is, an input signal Vm (the integrated analog input signal) to the 1-bit quantizer 420, and outputs a quantized digital signal. An output signal of the multi-bit quantizer 440 may include the quantization noise E since the quantization process of the multi-bit quantizer 440 can introduce noise and affect its output signal. The subtractor 451 of the error correction circuit 450 subtracts the output signal of the multi-bit quantizer 440 from the output signal of the 1-bit quantizer 420, and the differentiator 452 differentiates its result. The delay element 460 operates to receive the output signal of the 1-bit quantizer 420 and to delay it for a predetermined time. The subtractor 470 subtracts the output signal of the error correction circuit 450 from the output signal of the delay element 460 and generates an output signal Y at an output terminal.

In this process, the subtractor 451 calculates a correlation of the quantization noise occurring at each bit quantizer (420 and 440), and the differentiator 452 performs the function of high-pass filter for filtering noise introduced at each bit quantizer (420 and 440) and performs noise shaping which minimizes an amount of noise in a desired signal band. Since, in the final output stage, the noise of the 1-bit quantizer which is relatively high is removed and the noise of the multi-bit quantizer which is relatively small is minimized by the noise shaping using the differentiator, the characteristic of the signal-to-noise ratio can be improved.

Figure 5:
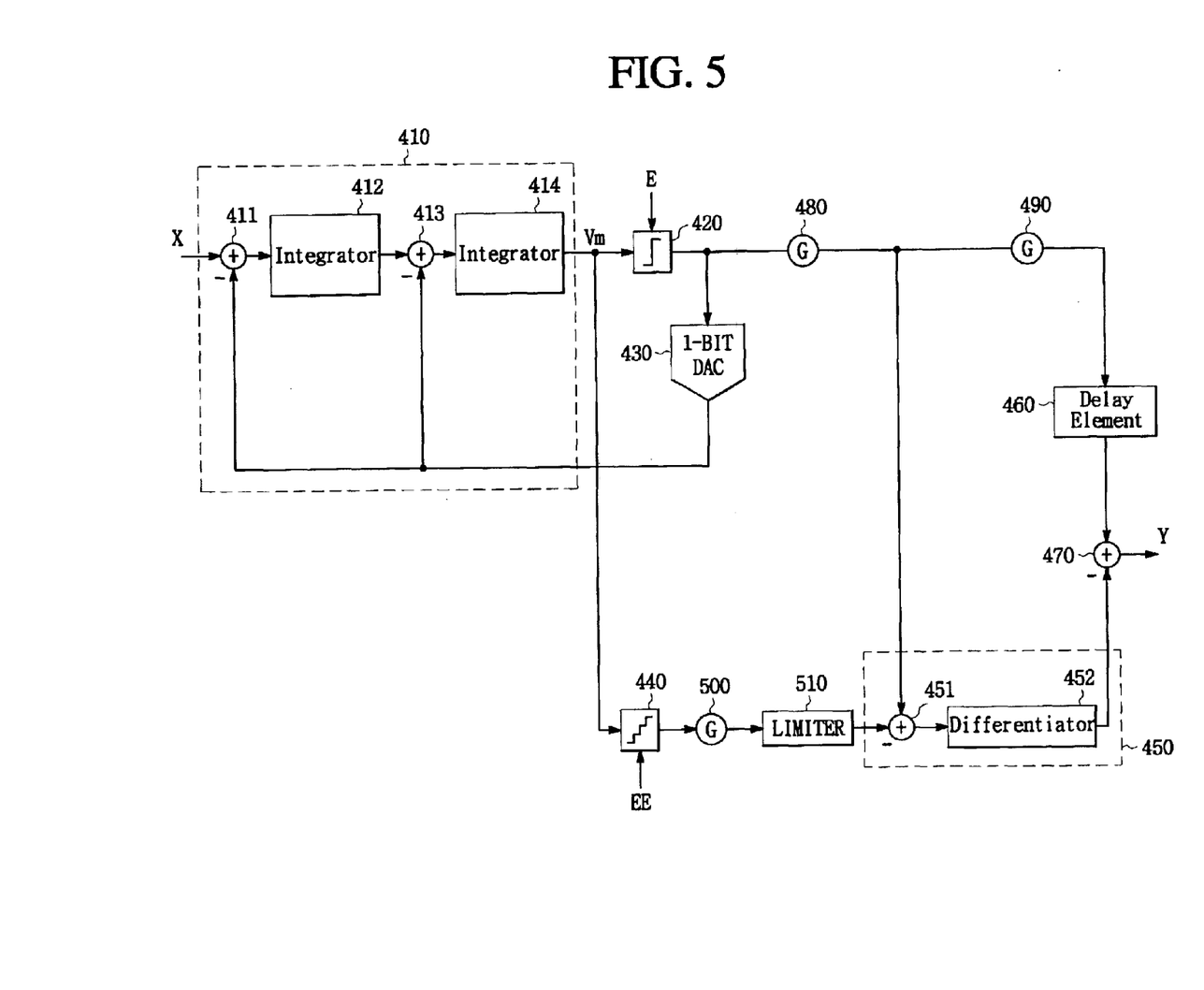
FIG. 5 is a view showing a second order Delta-Sigma modulator using a 1-bit quantizer and a multi-bit quantizer, with gain correction in accordance with a second embodiment of the present invention.

FIG. 5 is a diagram showing a second order Delta-Sigma modulator using a 1-bit quantizer and a multi-bit quantizer in accordance with a second embodiment of the present invention. The Delta-Sigma modulator of FIG. 5 further include a predetermined gain elements (480, 490, and 500) and a limiter 510 for correcting gain differences of each stage to the Delta-Sigma modulator of FIG. 4, in accordance with a second embodiment of the present invention. The Delta-Sigma modulator in accordance with a second embodiment of the present invention shown in FIG. 5 is identical with the Delta-Sigma modulator shown in FIG. 4 in accordance with the first embodiment of the present invention shown in FIG. 4 except that: the second embodiment further includes predetermined gain elements (480, 490, 500) for correcting the gain differences of each stage and a limiter 510 for limiting the output of the multi-bit quantizer 440 to a fixed level for removing a DC offset which can be generated by a multi-bit quantizer. So the description of previously described elements from FIG. 4 in FIG. 5 will be omitted.

The Delta-Sigma modulator shown in FIG. 5 includes an input terminal for inputting an analog input signal X; an output terminal for outputting a digital output signal Y; a 1-bit quantizer 420 being connected between the input terminal and the output terminal, for quantizing the inputted analog signal and outputting a first quantized digital signal; a 1-bit D/A converter 430 for converting the quantized digital signal into a quantized analog signal; a series of input integration circuits 410 including one or more stages each having a subtractor and an integrator, for subtracting a quantized analog output signal of the 1-bit D/A converter 430 from an analog input signal X, integrating the subtracted value, and sending its output to the 1-bit quantizer 420; a gain element 480 for giving a predetermined gain to a digital output signal of the 1-bit quantizer 420; a multi-bit quantizer 440 for quantizing an output signal of the series of input integration circuits 410 and outputting a second quantized digital signal; a gain element 500 for giving a predetermined gain to a digital signal of the multi-bit quantizer 440; a limiter 510 for stabilizing an output signal of the gain element 500; an error correction circuit 450 for receiving output signals of the limiter 510 and the gain element 480 and correcting their errors; a gain element 490 for giving a predetermined gain to a output signal of the gain element 480; a delay element 460 for delaying an output signal of the gain element 490; and a subtractor 470 for subtracting an output signal of the error correction circuit 450 from an output signal of the delay element 460 (between gain element 490 and subtractor 470) and outputting its result.

The series of input integration circuits 410 includes a first subtractor 411 for subtracting an analog output signal of the 1-bit D/A converter 430 from the analog input signal X; a first integrator 412 for integrating an output signal of the first subtractor 411; a second subtractor 413 for subtracting an analog output signal of the 1-bit D/A converter 430 from an output signal of the first integrator 412; and an second integrator 414 for integrating an output signal of the second subtractor 413.

The error correction circuit 450 includes a subtractor 451 for subtracting an output signal of the limiter 510 from the output signal of the gain element 480; and a differentiator 452 for differentiating an output signal of the subtractor 451.

The differentiator 452 can be a high-pass filter having a noise shaping characteristic such that the noise EE(z) is pushed out of a desired signal band and the desired signal band has only a comparatively small amount of noise.

Figure 6:
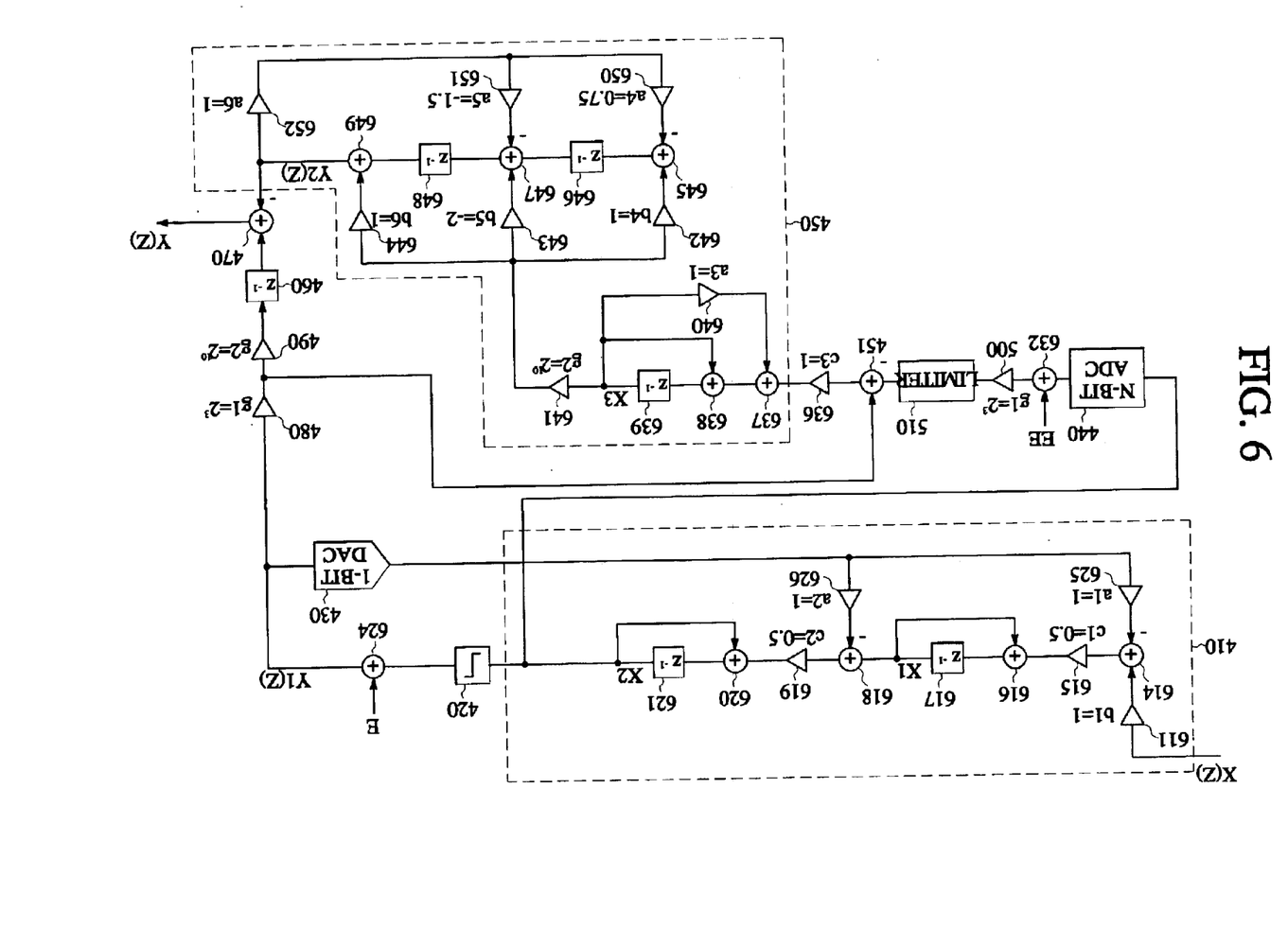
FIG. 6 is a detailed diagram showing the transfer function for the second order Delta-Sigma modulator of FIG. 5.

FIG. 6 is a detailed diagram showing the transfer functions of the second order Delta-Sigma modulator of FIG. 5.

In FIG. 6, as in FIG. 5, reference numeral 410 denotes a series of input integration circuits, reference numeral 420 denotes a 1-bit quantizer, reference numeral 430 denotes a 1-bit D/A converter, reference numeral 440 denotes a multi-bit quantizer, reference numeral 450 denotes an error correction circuit, reference numeral 460 denotes a delay circuit, reference numeral 470 denotes a subtractor, reference numerals 480, 490 and 500 denote gain elements, and a reference numeral 510 denotes a limiter respectively. For convenience of description, these reference numerals are used the same as the numerals used in FIG. 5. Triangles denote preedetermined gain elements (e.g., OpAmps). Numeral values described beside each gain element in FIG. 6 (a1=1, a2=1, a3=1, a4=0.75, a5=−1.5, a6=1, b1=1, b4=1, b5=−2, b6=1, c1=0.5, c2=0.5, g1=$2^3$, g2=$2^{10}$) denote coefficients of the transfer function used in the embodiment of the present invention.

The Summated signal Y1(z) of a signal transfer function and a noise transfer function, is expressed as follows:

$$Y1(z) = \frac{0.5}{z^2 - 1.5z + 0.75}X(z) + \frac{(z-1)^2}{z^2 - 1.5z + 0.75}E(z)$$

An input signal of the subtractor 451 will become g1(X2+E)−g1(X2+EE)=g1(E−EE). An output signal of the multi-bit quantizer 440 has smaller quantization noise EE, compared with an output signal of the 1-bit quantizer 420. Using the gain described in FIG. 6, X3 can be expressed as follows.

x3(z)=g1 (E(z)−EE(z))$z^{-1}$

Since the feedback loop of Delta-Sigma modulator shown in FIG. 6 has the noise E, the output will be Y(z)=f(X(z), E(z), EE(z)). If E in this function is removed, the output of the Delta-Sigma modulator can be expressed as follows. Y(z)=f(X(z), EE(z)). EE(z) is an error of the multi-bit quantizer 440 whose error is relatively small. By doing that, the noise E which has the most influence on a noise characteristic can be removed and then the error effect on the feedback loop of the Delta-Sigma modulator can be removed. So, the Delta-Sigma modulator shown in FIG. 6 has an excellent noise characteristic.

In order to remove the quantization noise E of the Delta-Sigma modulator, an output signal Y(z) can be expressed as follows.

$$y(z) = \left[g1 + z^{-1} + y1(z) - \frac{(z-1)^2}{Z^2 - 1.5z + 0.75}x3(z)\right]g2$$

Using the expressions 1 (defining Y1(z)) and 2 (defining X3(z)), an output signal Y(z) would be expressed as follows.

$$y(z) = \left[\frac{0.5z^{-1}}{z^2 - 1.5z + 0.75}X(z) + \frac{(z-1)^2 z^{-1}}{Z^2 - 1.5z + 0.75}EE(z)\right]g1 + g2$$

From the above numerical expression, it is noted that the quantization noise E is removed by means of cancellation and only quantization noise EE of the multi-bit quantizer remains unchanged. Also, from the expression 4, it is known that the Delta-Sigma modulator should include a high-pass filter of a second order having a delay time. The high-pass filter has a noise shaping characteristic that the noise EE(z) is pushed out of a desired signal band and the desired signal band has only a comparatively small amount of noise. That is, the high-pass filter is a kind of differentiator 452.

The Delta-Sigma modulator in accordance with the present invention shown in FIG. 6 can have an excellent characteristic of a signal-to-noise ratio in a desired signal band by removing a quantization noise E which is relatively high without causing loss of original signal and by noise shaping a quantization noise EE which is relatively small. Also, the Delta-Sigma modulator in accordance with the present invention can have an excellent SNR characteristic by making noise cancellation in a digital area even with a low OSR. Since gains g1 and g2 in FIG. 6 are used for calculating the signal as bits when an analog signal transfers to a digital signal, the gains have effect on only the magnitude of signal. Accordingly, for the characteristic of the signal-to-noise ratio over M bit, a product of g1 and g2 should be more than $2^{(M-1)}$. If a SNR characteristic more than 14 bits is needed, g1=$2^3$ and g2=$2^{10}$ should be embodied.

After quantization, a two's complement error correction circuit operation is performed. If a signal of M bits needs to be transformed, the operation should be performed within +($2^{M-1}$−1) to −($2^{M-1}$) in a normal case. However, if the operation is performed as above, the sum will not be 0 and therefore a DC value appears at an output terminal of the multi-bit quantizer 440. If the output of the multi-bit quantizer 440 is limited to +($2^{M-1}$−1) to −($2^{M-1}$−1), the sum can be made 0. This function is performed by a limiter 510 which limits an output of the multi-bit quantizer to a fixed level.

In the above embodiment, a simple second order Sigma-Delta modulator is used as an example. Generally, to obtain an excellent SNR characteristic, data conversion is performed using a higher order Sigma-Delta modulator. In that case, there is also a proportional relation between the OSR and a SNR characteristic of the modulator. The OSR should be properly selected since a desired SNR characteristic cannot be achieved if the OSR is too low. If a circuit proposed in the present invention is used, a quantization noise which is relatively high even in the higher order Sigma-Delta modulator can be removed and the deterioration of SNR characteristic due to the quantization noise can be improved. Accordingly, a Delta-Sigma modulator in accordance with the present invention can be adapted to a general A/D converter or a general D/A converter.

Figure 7:
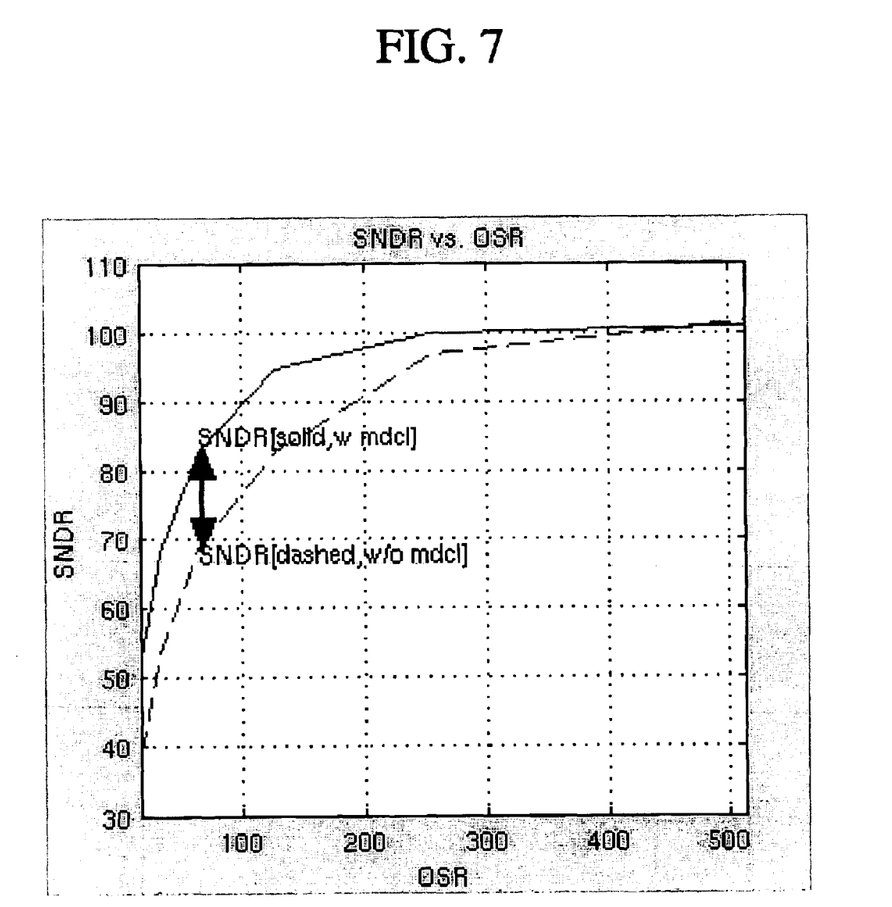
FIG. 7 is a view showing a simulation result of a signal-to-noise ratio in accordance with an oversampling ratio for a Delta-Sigma modulator in accordance with the present invention and a conventional Delta-Sigma modulator in which a quantization noise correction is not performed.

FIG. 7 is a view showing a simulation plotting the variation of signal-to-noise ratio resulting from a varying oversampling ratio (OSR) for a Delta-Sigma modulator in accordance with the present invention and a conventional Delta-Sigma modulator in which a quantization noise correction is not performed. A solid line shows a simulation result for a second order Delta-Sigma modulation embodied using the circuit and method of the present invention, and a dotted line shows a simulation result for a conventional Delta-Sigma modulator. As shown in FIG. 7, in case where the Delta-Sigma modulator has a high OSR, that is, when the OSR is 256 in case of FIG. 7, there is a modest SNR characteristic difference between the modulator of the present invention and the conventional modulator, and when the OSR is over 256, the modulator is operated in the saturation state. However, in case of a lower OSR, for example, in case where the OSR is 64 in the Delta-Sigma modulator of FIG. 7, there is a SNR characteristic difference greater than 15 dB between the modulator of the present invention and the conventional modulator. Under condition where the same-order modulators have the same OSRs, in other words, under condition that the modulator does not have a saturation characteristic but a full SNR characteristic, the Delta-Sigma modulator of the present invention can improve the characteristic more than 2.5 bits compared with the conventional Delta-Sigma modulator. This is a SNR characteristic improvement similar to the degree which can be obtained when the OSR is increased by twice, that is, doubled from 64 to 128. The modulator of the present invention obtains an effect equivalent to increasing the OSR by a factor of 2 compared with the conventional modulator in the above condition and the same order.

Figure 8:
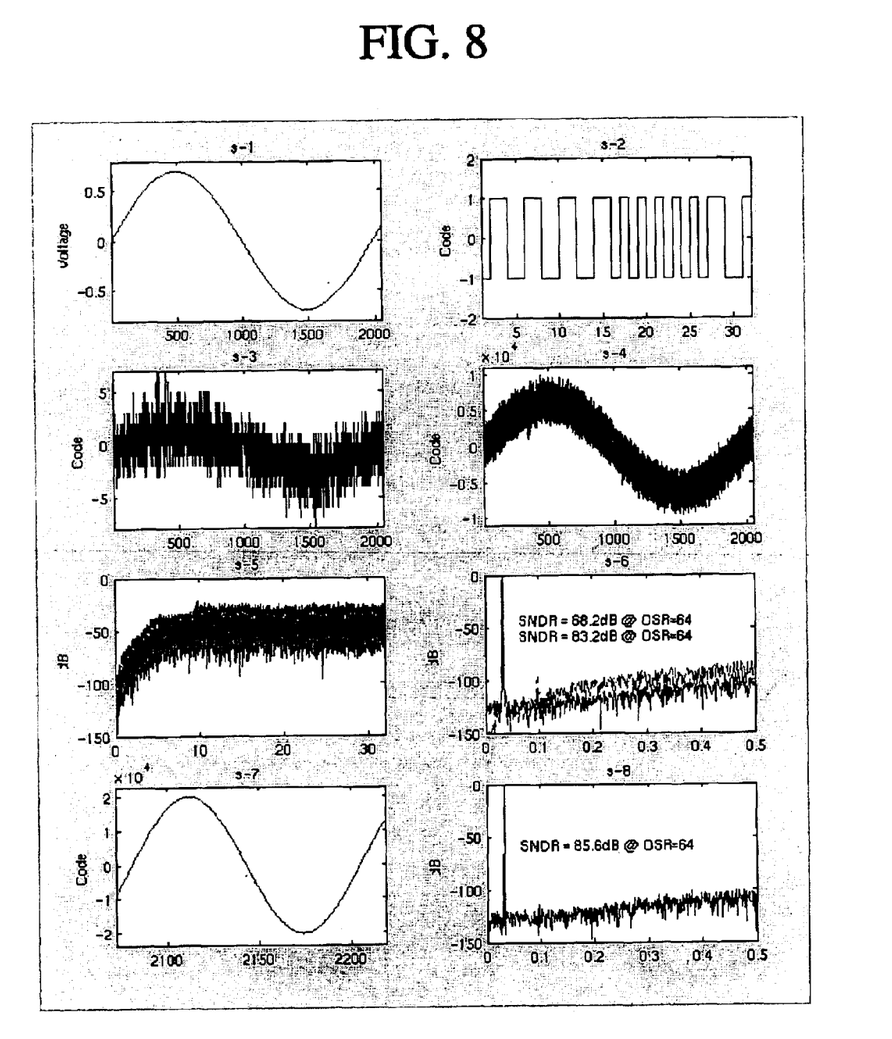
FIGS. 8 and 9 are views showing results of matlab system simulations for a Delta-Sigma modulator in accordance with the present invention and a conventional Delta-Sigma modulator in which a quantization noise correction is not performed.
Figure 9:
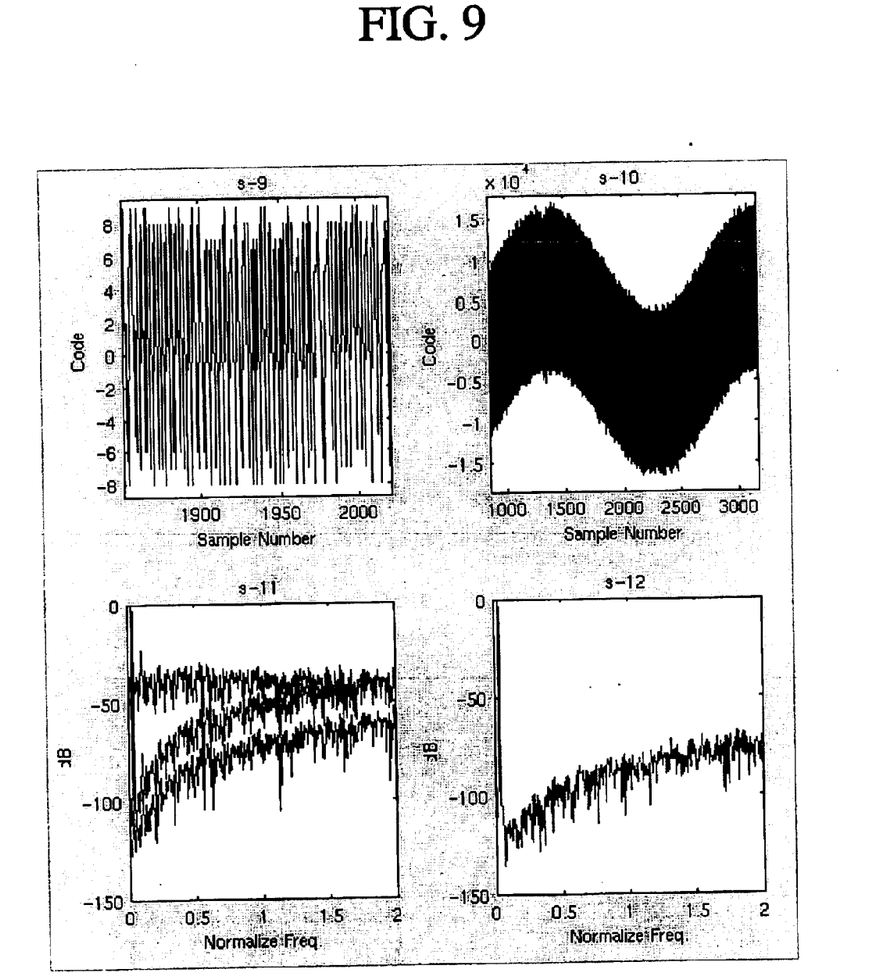

FIGS. 8 and 9 are views showing results of matlab system simulations for a Delta-Sigma modulator in accordance with the present invention and a conventional Delta-Sigma modulator. FIGS. 8 and 9 show simulation results in case that the order of the modulator is 2 and OSR is 64.

In FIG. 8: (s-1) indicates voltage input signal X (ranging from −0.707 to +0.707 volts); (s-2) indicates an output signal Y of a (FIG. 3) modulator in accordance with a conventional method; (s-3) indicates output signals (4 bits, −7 to +7) of a limiter 510 which have passed a multi-bit quantizer 440 in a modulator of the present invention; (s-4) indicates an output signal Y(z) of the modulator of the present invention; (s-5) indicates an FFT result of a simulation result for the Delta-Sigma modulator of the present invention and the conventional Delta-Sigma modulator; (s-6) indicates a magnified view of the result of (s-5), which is magnified up to a signal band width (0.5); (s-7) indicates a result in which the output of the Delta-Sigma modulator in accordance with the present invention is inputted into a fourth order's Digital Sync Filter and then the output is downsampled in 16 downsampling; and (s-8) indicates an FFT result of the result of the Digital Sync Filter.

An upper part of (s-5) indicates an FFT result for the Delta-Sigma modulator of the present invention, and lower part of it indicates an FFT result for a conventional Delta-Sigma modulator. As shown in (s-6), as a result of magnifying the result of (s-5) up to the signal band width (0.5) only, the signal-to-noise ratio (SNR) characteristic is improved by 15 dB(2.5 bits).

In FIG. 9: (s-9) indicates a resulting difference of error values of output signals of a 1-bit quantizer 420 and a multi-bit quantizer 440 of a Delta-Sigma modulator of the present invention; and (s-10) indicates a result Y2(z) of digital error correction of the Delta-Sigma modulator of the present invention; (s-11) indicates an FFT result for the (s-9) and the (s-10); (s-12) indicates a FFT result (the result of a FFT of (s-8) in FIG. 8) through a Digital Sync Filter.

An upper waveform in the (s-11) indicates an FFT result of the waveform of the (s-9); a middle waveform indicates an FFT result of the waveform of the (s-10), and a lower waveform indicates a waveform of the final output signal Y(z) of the Delta-Sigma modulator of the present invention. The upper waveform is a waveform which did not perform a noise shaping, and the middle waveform is a waveform which performed a noise shaping. A quantization noise E which has much effect on the characteristic of the Delta-Sigma modulator is removed by an error correction process and a remaining quantization noise EE is removed by high-pass filtering in a differentiator 452.

As described above, a Delta-Sigma modulator in accordance with the present invention includes a 1-bit quantizer 420, a multi-bit quantizer 440 and an error correction circuit, reduces a quantization noise by correcting errors in a digital area using digital output signals of the multi-bit quantizer 440 and of the 1-bit quantizer 420, and removes a DC offset which can be generated by the multi-bit quantizer 440. Also, the Delta-Sigma modulator in accordance with the present invention can improve a signal-to-noise ratio (SNR) and may be applied to a field of RF applications where a higher OSR can not be achieved since a bandwidth of RF signal becomes wide and an embodiment of a higher order is not practicable because of a burden of high speed.

While this invention has been described in connection with what is presently considered to be the most practical and preferred embodiment, it is to be understood that the invention is not limited to the disclosed embodiment, but the invention is intended to cover various modifications within the spirit and scope of the appended claims, wherein "N" is a positive integer.

What is claimed is:

1. A Delta-Sigma modulator, for inputting an analog input signal and for outputting a digital output signal, comprising:
   an integration unit for receiving the analog input signal and for outputting an integrated signal;
   a 1-bit quantizer for quantizing the integrated signal output by the integration unit and for outputting a first quantized digital signal;
   a N-bit quantizer for quantizing the integrated signal output by the integration unit and for outputting a second quantized digital signal; and
   an error correction circuit, for digitally correcting quantization noise by using the first and second quantized digital signals of the 1-bit quantizer and the N-bit quantizer, respectively, and for reducing the quantization noise when the Delta-Sigma modulator transforms the analog input signal into a digital output signal of the Delta-Sigma modulator.

2. The Delta-Sigma modulator of claim 1, wherein:
   the integration unit includes one or more stages, each stage having a subtractor and further having an integrator for integrating the analog input signal.

3. The Delta-Sigma modulator of claim 1,
   further comprising a 1-bit digital-to-analog (D/A) converter for converting the first quantized digital signal output by the a 1-bit quantizer into a quantized analog signal; and wherein
   the integration unit includes two or more integrating stages, each integrating stage having a subtractor and an Integrator connected in series with its respective subtractor;
   wherein each subtractor is adapted to subtract the quantized analog signal from the analog input signal; and wherein
   each integrator is adapted to integrate the output of its respective subtractor.

4. The Delta-Sigma modulator of claim 3, wherein N is at least 2.

5. A Delta-Sigma modulator, for inputting an analog input signal and for outputting a digital output signal, comprising:
   an integration unit including one or more stages each stage having a subtractor for subtracting a quantized analog output signal output by a 1-bit D/A converter from the analog input signal, and an integrator for integrating an output of its respective subtractor; a 1-bit quantizer for quantizing the integrated signal output by the integration unit and for outputting a first quantized digital signal;

the 1-bit digital-to-analog (D/A) converter for converting the first quantized digital signal into the quantized analog signal;

a N-bit quantizer for quantizing the integrated signal output by the integration unit and for outputting a second quantized digital signal;

a terminal subtractor for subtracting a digital error signal which is a derivative of the second quantized digital signal from the first quantized digital signal and outputting its result as the digital output signal of the Delta-Sigma modulator.

6. The Delta-Sigma modulator of claim 5, further comprising:

an error correction circuit for receiving the second quantized digital signal from the N-bit quantizer and for receiving the first quantized digital signal from the 1-bit quantizer, and for correcting their quantization errors, and for outputing the digital error signal to the terminal subtractor.

7. The Delta-Sigma modulator of claim 5, further comprising:

a delay element for delaying the first quantized digital signal output by the 1-bit quantizer, and for outputting the first quantized digital signal to the terminal subtractor.

8. The Delta-Sigma modulator according to claim 7, wherein the error correction circuit includes: a third subtractor for subtracting the second digitized output signal output by the N-bit quantizer from the first digitized output signal output by the 1-bit quantizer; and a differentiator for differentiating an output signal of the third subtractor.

9. The Delta-Sigma modulator according to claim 8, wherein the differentiator performs a high-pass filtering of the output signal of the third subtractor.

10. The Delta-Sigma modulator according to claim 5, further comprising:

a limiter for limiting the output of the N-bit quantizer and removing a DC offset between the N-bit quantizer and the error correction circuit.

11. The Delta-Sigma modulator according to claim 5, wherein the Delta-Sigma modulator is as second order Delta-Sigma modulator adapted for use as an analog-to-digital (A/D) converter for converting an analog signal to a digital signal.

12. A Delta-Sigma modulator for inputting an analog input signal and for outputting a digital output signal, comprising:

a 1-bit quantizer for quantizing the analog input signal and for outputting a first quantized digital signal;

a 1-bit D/A converter for converting the first quantized digital signal into a quantized analog signal;

a series of input integration circuits including a first subtractor and a first integrator for integrating an output of the first subtractor, wherein the first subtractor subtracts the quantized analog output signal output by the 1-bit D/A converter from the analog input signal; and a second integratoroutputs an integrated signal to the 1-bit quantizer;

a first gain element for providing a first predetermined gain to a first quantized digital signal output by the 1-bit quantizer;

a N-bit quantizer for quantizing the integrated signal output by the series of input integration circuits and outputting a second quantized digital signal;

a second gain element for providing a second predetermined gain to the second quantized digital signal output by the N-bit quantizer;

an error correction circuit for receiving first and second quantized digital signal signals from the first gain element and the second gain element respectively, and correcting the quantization errors, and for outputting a resulting digital error signal;

a third gain element for providing a third predetermined gain to the first quantized digital signal output by the first gain element;

a delay element for delaying the first quantized digital signal output by the third gain element; and a terminal subtractor for subtracting the digital error signal output by the error correction circuit from the first quantized digital signal output by the delay element, and for outputting the result as the digital output signal of the Delta-Sigma modulator.

13. The Delta-Sigma modulator according to claim 12, wherein the error correction circuit includes a third subtractor for subtracting the second quantized digital signal output by the second gain element from the first quantized digital signal output by the first gain element; and a differentiator for differentiating an output signal of the third subtractor.

14. The Delta-Sigma modulator according to claim 13, wherein differentiator performs a high-pass filtering of the output signal of the third subtractor.

15. The Delta-Sigma modulator according to claim 12, further comprising:

a limiter operatively connected between the second gain element and the error correction circuit.

16. The Delta-Sigma modulator according to claim 12, wherein the first predetermined gain and the second predetermined gain have the same value.

17. The Delta-Sigma modulator according to claim 12, wherein the Delta-Sigma modulator is a second order Delta-Sigma modulator and is used as an A/D converter for converting an analog signal to a digital signal.

* * * * *